(12) United States Patent
Dhindsa et al.

(10) Patent No.: US 9,184,074 B2
(45) Date of Patent: Nov. 10, 2015

(54) APPARATUS AND METHODS FOR EDGE RING IMPLEMENTATION FOR SUBSTRATE PROCESSING

(75) Inventors: Rajinder Dhindsa, San Jose, CA (US); Alexei Marakhtanov, Albany, CA (US)

(73) Assignee: Lam Research Corporation, Fremont, CA (US)

(*) Notice: Subject to any disclaimer, the term of this patent is extended or adjusted under 35 U.S.C. 154(b) by 143 days.

(21) Appl. No.: 12/951,886

(22) Filed: Nov. 22, 2010

(65) Prior Publication Data

US 2011/0070743 A1 Mar. 24, 2011

Related U.S. Application Data

(62) Division of application No. 11/770,658, filed on Jun. 28, 2007, now Pat. No. 7,837,827.

(51) Int. Cl.
*C03C 15/00* (2006.01)
*H01L 21/3065* (2006.01)
*H01L 21/673* (2006.01)
*H01J 37/32* (2006.01)

(52) U.S. Cl.
CPC ....... *H01L 21/6732* (2013.01); *H01J 37/32091* (2013.01); *H01J 37/32623* (2013.01); *H01J 37/32642* (2013.01); *Y10S 156/915* (2013.01)

(58) Field of Classification Search
CPC .................................................. H01J 37/32642
USPC ............ 118/723 E, 728; 156/345.43, 345.44, 156/345.45, 345.46, 345.47, 345.51; 361/234; 250/281; 438/710, 706; 279/128
See application file for complete search history.

(56) References Cited

U.S. PATENT DOCUMENTS 5,740,009 A * 4/1998 Pu et al. .................. 361/234
6,344,105 B1 * 2/2002 Daugherty et al. ...... 156/345.51
(Continued)

FOREIGN PATENT DOCUMENTS

JP 2002190466 A * 7/2002
JP 2002246370 8/2002
(Continued)

OTHER PUBLICATIONS

"Written Opinion", Issued in Singapore Application No. 200908379-1; Mailing Date: Mar. 25, 2011.
(Continued)

*Primary Examiner* — Sylvia R MacArthur
*Assistant Examiner* — Anna Crowell
(74) *Attorney, Agent, or Firm* — Beyer Law Group LLP

(57) ABSTRACT

A method for processing a substrate in a plasma processing chamber is provided. The substrate is disposed above a chuck and surrounded by a first edge ring. The first edge ring is electrically isolated from the chuck. The method includes providing a second edge ring. The second edge ring is disposed below an edge of the substrate. The method also includes providing a coupling ring. The coupling ring is configured to facilitate RF coupling from an ESC (electrostatic chuck) assembly to the first edge ring, thereby causing the first edge ring to have an edge ring potential during substrate processing and causing the RF coupling to be maximized at the first edge ring and minimized at the second edge ring during the substrate processing. The method also includes providing an insulator ring, wherein the second edge ring is disposed above the insulator ring.

9 Claims, 4 Drawing Sheets

(56) References Cited

U.S. PATENT DOCUMENTS

| | | | |
|---|---|---|---|
| 6,554,954 B2 * | 4/2003 | Ma et al. | 156/345.51 |
| 6,676,804 B1 | 1/2004 | Koshimizu et al. | |
| 6,896,765 B2 | 5/2005 | Steger | |
| 7,244,336 B2 * | 7/2007 | Fischer et al. | 156/345.51 |
| 7,658,816 B2 * | 2/2010 | Koshiishi et al. | 156/345.43 |
| 7,867,356 B2 * | 1/2011 | Tong et al. | 156/379.6 |
| 7,988,814 B2 * | 8/2011 | Koshiishi | 156/345.43 |
| 2002/0022281 A1 | 2/2002 | Flanner et al. | |
| 2002/0059981 A1 * | 5/2002 | Hao et al. | 156/345.47 |
| 2002/0187647 A1 | 12/2002 | Dhindsa et al. | |
| 2003/0006008 A1 | 1/2003 | Horioka et al. | |
| 2003/0148611 A1 | 8/2003 | Dhindsa et al. | |
| 2004/0000375 A1 | 1/2004 | Liu et al. | |
| 2004/0031564 A1 * | 2/2004 | Gottscho et al. | 156/345.24 |
| 2004/0083975 A1 * | 5/2004 | Tong et al. | 118/728 |
| 2005/0005859 A1 | 1/2005 | Koshiishi et al. | |
| 2005/0133164 A1 | 6/2005 | Fischer et al. | |
| 2006/0043067 A1 * | 3/2006 | Kadkhodayan et al. | 216/67 |
| 2007/0032081 A1 * | 2/2007 | Chang et al. | 438/689 |
| 2007/0111339 A1 | 5/2007 | Wege et al. | |
| 2007/0215279 A1 * | 9/2007 | Koshiishi | 156/345.3 |

FOREIGN PATENT DOCUMENTS

| | | |
|---|---|---|
| JP | 2003-503841 | 1/2003 |
| JP | 2004079820 | 3/2004 |
| JP | 3100986 | 6/2004 |
| WO | WO-0101445 A1 | 1/2001 |
| WO | WO-03043061 A1 | 5/2003 |
| WO | WO-2004/027815 A1 | 4/2004 |
| WO | WO-2006/026110 A2 | 3/2006 |

OTHER PUBLICATIONS

"U.S. Appl. No. 11/770,658", filed Jun. 28, 2007.
"Non Final Office Action", U.S. Appl. No. 11/770,658, Mailing Date: Mar. 15, 2010.
"International Search Report", issued in PCT Application No. PCT/US2008/067578; Mailing Date: Oct. 29, 2008.
"Written Opinion", Issued in PCT Application No. PCT/US2008/067578; Mailing Date: Oct. 29, 2008.
"International Preliminary Report on Patentability", Issued in PCT Application No. PCT/US2008/067578; Mailing Date: Jan. 14, 2010.
"Danish Search and Examination Report", Singapore Patent Application No. 200908379-1, Mailing Date: Nov. 21, 2011.
Office Action (Nov. 27, 2012).

* cited by examiner

APPARATUS AND METHODS FOR EDGE RING IMPLEMENTATION FOR SUBSTRATE PROCESSING

PRIORITY CLAIM

The present application is a divisional under 37 CFR 1.53 (b) and claims priority under 35 USC 120 from the following application "EDGE RING ARRANGEMENTS FOR SUBSTRATE PROCESSING", application Ser. No. 11/770,658, U.S. Pat. No. 7,837,827, issued Nov. 23, 2010, filed by the same inventors herein on Jun. 28, 2007.

BACKGROUND OF THE INVENTION

Growth in the semiconductor industry has been driven by advances in plasma processing. Due to the highly competitive nature of the semiconductor, device manufacturers may want to maximize yield and efficiently utilize the real estate available on a substrate. During plasma processing of the substrate, a plurality of parameters may need to be controlled to ensure high yield of devices being processed. A common cause of defective devices is the lack of uniformity during substrate processing. Factors that may affect uniformity are substrate edge effects. Another cause of defective devices may be due to polymeric by-products flaking off from the backside of one substrate onto another substrate during transport.

Current fabrication technologies are challenged by the demand for higher performance devices, the pressure to further reduce substrate feature sizes, as well as the implementation of newer optimized substrate materials. For example, it is becoming increasing difficult to maintain the uniformity or process results from the center to the edge of larger substrates (e.g., >300 mm). In general, for a given feature size, the number of devices on the substrate near the edge increases as the size of the substrate becomes larger. Likewise, for a given substrate size, the number of devices on the substrate near the edge increases as the feature size of the devices decreases. For example, often over 20% the total number of devices on a substrate are located near the perimeter the substrate.

FIG. 1 shows a simplified diagram of a capacitively-coupled plasma processing system with a single hot edge ring. In general, a source RF generated by source RF generator 112 is commonly used to generate the plasma as well as control the plasma density via capacitively coupling. Certain etch applications may require upper electrode to be grounded with respect to a lower electrode, which is RF powered. The RF power is at least one of 2 MHz, 27 MHz, and 60 MHz. Still other etch applications may require both the upper electrode and the lower electrode to be RF powered using similar RF frequencies.

Generally, an appropriate set of gases is flowed through an inlet in an upper electrode 102. The gases are subsequently ionized to form plasma 104, in order to process (e.g., etch or deposit) exposed areas of substrate 106, such as a semiconductor substrate or a glass pane, positioned with a hot edge ring (HER) 116 (e.g., Si, etc.) on an electrostatic chuck (ESC) 108, which also serves as a powered electrode.

Hot edge ring 116 generally performs many functions, including positioning substrate 106 on ESC 108 and shielding the underlying components not protected by the substrate itself from being damaged by the ions of the plasma. Hot edge ring 116, as shown in FIG. 1, is disposed under and around the edge of substrate 106. Hot edge ring 112 may further sit on coupling ring 114 (e.g., quartz, etc.), which is generally configured to provide a current path from chuck 108 to hot edge ring 116.

In the example of FIG. 1, insulator rings 118 and 120 are configured to provide insulation between ESC 108 and ground ring 122. Quartz cover 124 is disposed on top of ground ring 122. Material for coupling ring 114 may be quartz or appropriate material to optimize RF coupling from ESC 108 to HER 116. For example, quartz may be employed as coupling ring 114 to minimize RF coupling to HER 116. In another example, aluminum may be employed as coupling ring 114 to get increase RF coupling to HER 116.

Due to substrate edge effects, such as electric field, plasma temperature, and the loading effects from process chemistry, the process results near the substrate edge may differ from the remaining (center) area of the substrate during plasma processing. For example, the electric field around substrate 106 edge may change due to changes from RF coupling to HER 116. The equipotential lines of the plasma sheath may become disrupted, causing non-uniform ion angular distribution around the substrate edge.

Generally, it is desirable for the electric field to remain substantially constant over the entire surface of the substrate in order to maintain process uniformity and vertical etch profiles. During plasma processing, RF coupling balance between substrate 106 and HER 116 may be optimized by design to maintain process uniformity and vertical etch. For example, RF coupling to HER 116 may be optimized for maximum RF coupling to get uniform etching. However, the RF coupling balance to maintain process uniformity may come at a cost to beveled edge polymer deposition.

During the etch process, it may be common for polymer byproducts (e.g., fluorinated polymers, etc.) to form on the substrate backside and/or around the substrate edge. Fluorinated polymers generally are comprised of photo resist material previously exposed to an etch chemistry, or polymer byproducts deposited during a fluorocarbon etch process. In general, a fluorinated polymer is a substance with a chemical equation of $C_xH_yF_z$, where x, z are integers greater than 0, and y is an integer greater than or equal to 0 (e.g., $CF_4$, $C_2F_6$, $CH_2F_2$, $C_4F_8$, $C_5F_8$, etc.).

However, as successive polymer layers are deposited on the edge area as the result of several different etch processes, organic bonds that are normally strong and adhesive will eventually weaken and peel or flake off, often onto another substrate during transport. For example, substrates are commonly moved in sets between plasma processing systems via substantially clean containers, often called cassettes. As a higher positioned substrate is repositioned in the container, a portion of a polymer layer may fall on a lower substrate where dies are present, potentially affecting device yield.

FIG. 2 shows a simplified diagram of a substrate in which a set of edge polymers have been deposited on the planar backside is shown. As previously stated, during the etch process, it may be common for polymer by-products (edge polymers) to form on the substrate. In this example, the polymer by-products have been deposited on the planar backside, that is, the side of the substrate away from the plasma. For example, the polymer thickness may be about 250 nm at about 70° 202, 270 nm at about 45° 204, and about 120 nm at 0° 206. In general, the greater the thickness of the polymer, the higher the probability that a portion of the polymer may become dislodged and fall onto another substrate or the chuck, potentially affecting manufacturing yield.

For example, RF coupling to HER 116 may be optimized for minimal RF coupling to reduce polymer by-products deposition on beveled edge. However, the RF coupling balance to minimize beveled edge polymer deposition may come at a cost to maintain process uniformity at substrate edge.

Hence, aforementioned prior art methods require RF coupling balance between the hot edge ring and the substrate to trade-off between optimizing for edge uniformity or beveled edge polymer deposition. In addition, arcing between the wafer edge and hot edge ring may cause pitting on substrate edge and damage to the devices, thereby reducing yield.

SUMMARY OF THE INVENTION

The invention relates, in an embodiment, to a method for processing a substrate in a plasma processing chamber. The substrate is disposed above a chuck and surrounded by a first edge ring. The first edge ring is electrically isolated from the chuck. The method further includes providing a second edge ring and disposing an edge of the substrate above the second edge ring. The method further provides a coupling ring to facilitate RE coupling from an ESC (electrostatic chuck) assembly to the first edge ring, wherein the ESC assembly includes the chuck. The method further includes optimizing the RE coupling to minimize a potential difference between the substrate and the first edge ring. The method further includes maximizing a potential difference between the substrate and the second edge ring to induce arcing on the edge of the substrate. The method further includes using the arcing to remove polymer by-products deposited on the edge of the substrate.

The above summary relates to only one of the many embodiments of the invention disclosed herein and is not intended to limit the scope of the invention, which is set forth in the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF EMBODIMENTS

Figure 1:
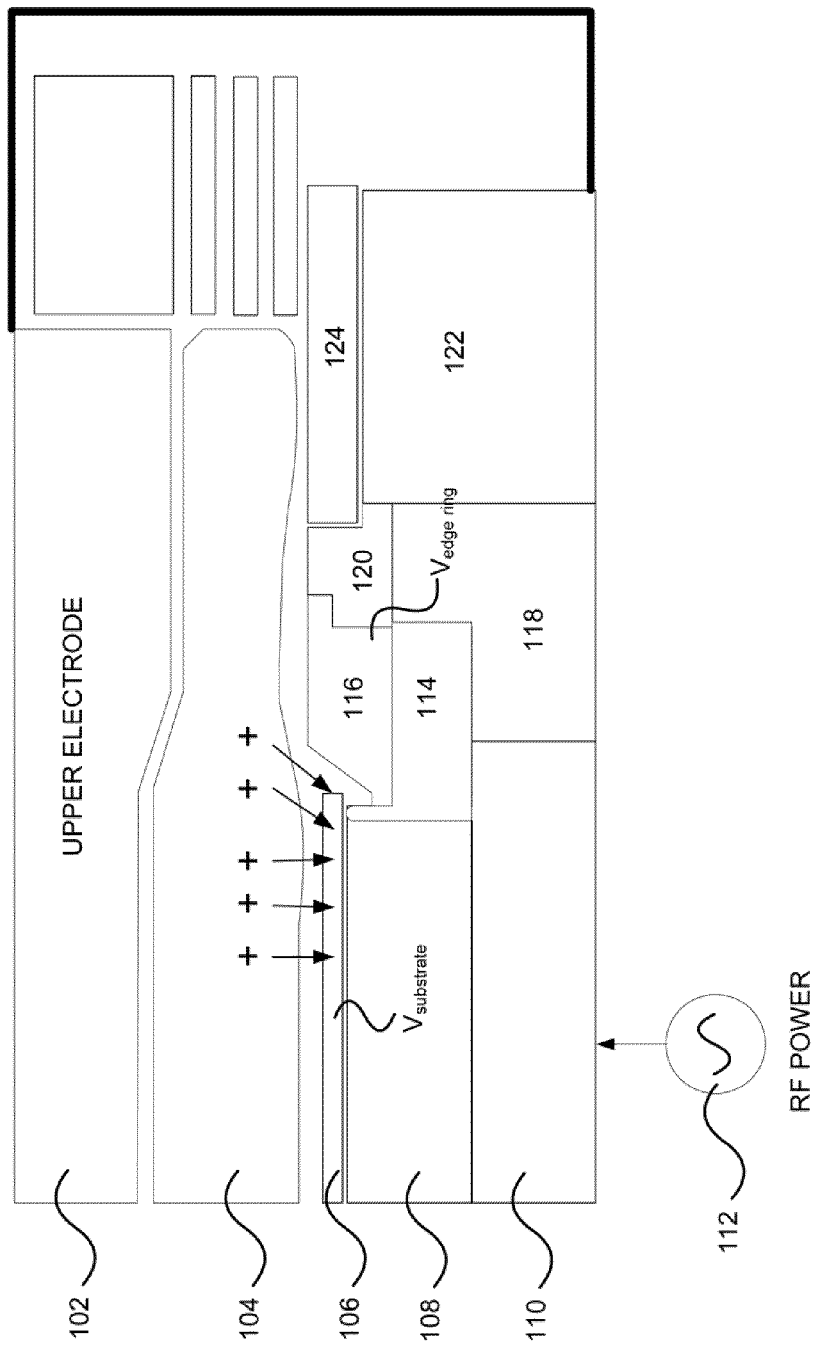
FIG. 1 shows a simplified diagram of a capacitively-coupled plasma processing system with a single hot edge ring.
Figure 2:
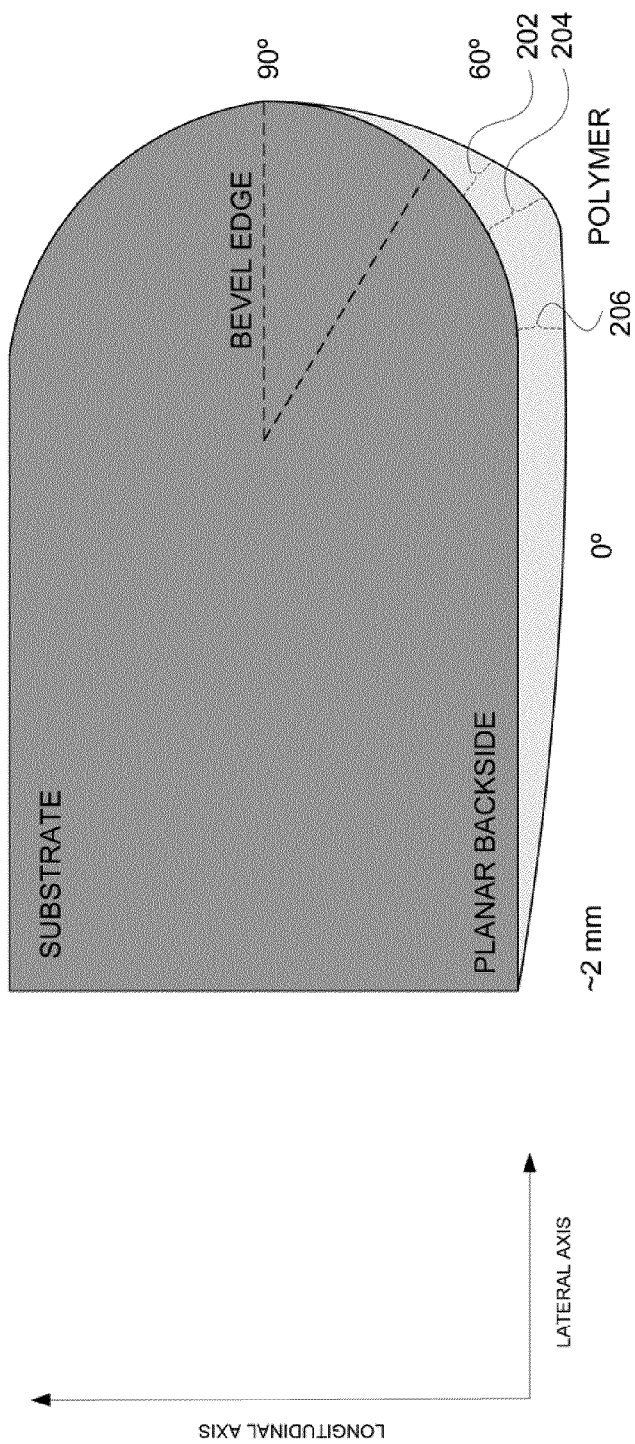
FIG. 2 shows a simplified diagram of a substrate in which a set of edge polymers have been deposited on the planar backside is shown.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Various embodiments are described hereinbelow, including methods and techniques. It should be kept in mind that the invention might also cover articles of manufacture that includes a computer readable medium on which computer-readable instructions for carrying out embodiments of the inventive technique are stored. The computer readable medium may include, for example, semiconductor, magnetic, opto-magnetic, optical, or other forms of computer readable medium for storing computer readable code. Further, the invention may also cover apparatuses for practicing embodiments of the invention. Such apparatus may include circuits, dedicated and/or programmable, to carry out tasks pertaining to embodiments of the invention. Examples of such apparatus include a general-purpose computer and/or a dedicated computing device when appropriately programmed and may include a combination of a computer/computing device and dedicated/programmable circuits adapted for the various tasks pertaining to embodiments of the invention.

In accordance with embodiments of the invention, there are provided arrangements for configuring a plasma processing system to enhance control over plasma processing parameters. Embodiments of the invention include providing independent RF coupling to a plurality of hot edge rings to produce desired electric potential differences between a substrate and each edge ring. Thus, the equipotential lines of the plasma sheath for a given plasma process may be optimized to achieve uniform etching at a substrate edge without sacrificing cleaning of polymer by-products from the beveled edge of the substrate.

In one or more embodiments of the invention, a first hot edge ring is disposed around the edge of a substrate. In an embodiment, first HER may be made of silicon (Si), silicon nitride (SiN), and/or silicon dioxide ($SiO_2$). In an embodiment, first HER may further sit on a coupling ring to provide RF coupling from ESC lower electrode to first HER to minimize potential difference between substrate and first HER. Thus, the equipotential lines of the plasma sheath for a given plasma process is optimized to keep ion bombardment to the edge of substrate straight. The vertical ion bombardment at the edge of substrate may ensure uniform etching with respect to the center of the substrate during plasma processing.

In an embodiment, a second HER, isolated by an insulator ring, is disposed underneath the edge of a substrate. Second HER may be made from silicon (Si), silicon nitride (SiN), and/or silicon dioxide ($SiO_2$) in an embodiment. Second HER is isolated from the substrate, the first edge ring, an ESC, and an ESC lower body by the insulator ring. The insulator ring may be made from insulator material such as quartz to achieve RF decoupling from ESC lower electrode. Embodiments of the invention provide for high voltage potential between the substrate and the second HER to cause arcing on the beveled edge of substrate to remove polymer by-products deposited on beveled edge of the substrate.

In another embodiment of the invention, a second HER is disposed directly underneath the substrate and on top of the insulator ring. In an embodiment, second HER may be made from SiN or $SiO_2$. In an embodiment, RF coupling to second HER may be optimized to provide maximum potential difference between the substrate and the second HER to induce arcing on the beveled edge of the substrate for cleaning of polymer by-products.

Figure 3:
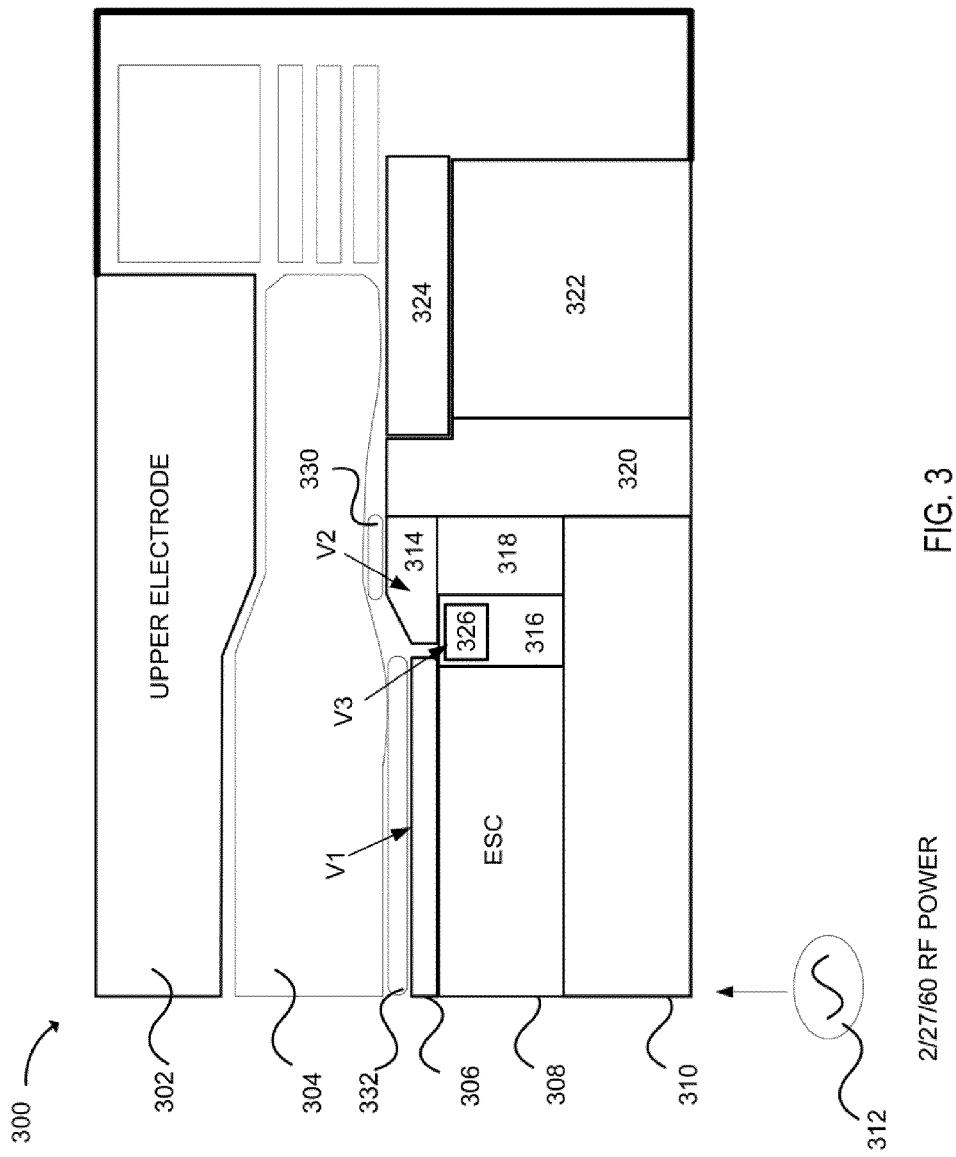
FIG. 3 shows, in accordance with an embodiment of the present invention, a simplified schematic of a capacitively-coupled plasma processing system configured with dual edge rings.

The features and advantages of the invention may be better understood with reference to the figures and discussions that follow. FIG. 3 shows, in accordance with an embodiment of the present invention, a simplified schematic of a capacitively-coupled plasma processing system 300 configured with dual edge rings.

Plasma processing system 300 may be a single, double, or triple frequency RF capacitively discharge system. In an example, radio frequencies may include, but are not limited to, e.g., 2 MHz, 27 MHz, and 60 MHz. Plasma processing system 300 may be configured to include a substrate 306 being disposed above an electrostatic chuck (ESC) 308. ESC 308, which also serves as a powered electrode, is disposed above an ESC lower electrode 310.

Consider the situation wherein, for example, substrate 306 is being processed. During plasma processing, a multifrequency RF generator 312 with a path to ground (not shown to simplify the figure) may supply low RF bias power to ESC lower electrode 310 through an RE match network (not shown to simplify the figure). The RF power from RF generator 312 may interact with a gas (not shown to simplify the figure) to ignite plasma 304 between an upper electrode 302 and substrate 306. Plasma may be employed to etch and/or deposit materials onto substrate 306 to create electronic, devices.

As shown in FIG. 3, certain etch applications may require upper electrode 302 to be grounded with respect to a lower electrode, which is RF powered. The RF power is at least one of 2 MHz, 27 MHz, and 60 MHz. Still other etch applications may require both the upper electrode and the lower electrode to be RF powered using similar RF frequencies.

In contrast to the prior art where only one hot edge ring is employed, plasma processing system 300 is configured with a plurality of hot edge rings (HER), e.g., a first HER 314 and a second HER 326 in an embodiment. First HER 314 is disposed around the edge of substrate 306 in accordance with an embodiment of the invention. First HER 314 may be made from silicon (Si), silicon nitride (SiN), and/or silicon dioxide ($SiO_2$) in an embodiment. An insulator ring 320 may provide insulation between first HER 314 and a ground ring 322. A quartz cover ring 324 is disposed on top of ground ring 322. First HER 314 may further sit on a coupling ring 318. Coupling ring 318 may be made from conductive materials such as aluminum or graphite to provide RF coupling from ESC assembly, e.g., ESC 308 and ESC lower electrode 310, to first HER 314.

RF coupling from ESC assembly to HER 314 may be optimized to achieve similar plasma sheath between an area of RF sheath voltage (V2) above the substrate edge ring 330 with respect to an area of RF sheath voltage (V1) above the substrate 332 to produce minimal electrical potential differences (V1-V2) in accordance with an embodiment. Thus, the equipotential lines of the plasma sheath for a given plasma process is optimized to keep ion bombardments to the edge of substrate 306 straight. The vertical ion bombardments at the edge of substrate 306 may ensured uniform etching with respect to the center of the substrate during plasma processing.

In the implementation of FIG. 3, second HER 326, isolated by an insulator ring 316, is disposed underneath the edge of substrate 306 in accordance with an embodiment. Second HER 326 may be made from silicon (Si), silicon nitride (SiN), and/or silicon dioxide ($SiO_2$) in an embodiment. Second HER 326 is isolated from substrate 306, first edge ring 314, ESC 308, and ESC lower body 310 by insulator ring 316 in accordance with an embodiment of the invention. Insulator ring 316 may be made from insulator material such as quartz to achieve RF decoupling from ESC assembly.

Since RF coupling to second HER 326 may be minimized, the induced voltage (V3) on second HER 326 may be low in comparison the voltage on substrate 306 (V1). The voltage potential (V1-V3) between substrate 306 and second HER 326 may be high. Due to the high voltage potential between substrate 306 and second HER 326, arcing may occur on the beveled edge of substrate 306. Normally, arcing is an uncontrolled event that is undesirable. However, there are no devices on the beveled edge of a substrate. Thus, arcing or micro-explosion on the beveled edge of substrate 306 may be desirable as a cleaning mechanism to remove polymer by-products deposited on beveled edge of the substrate in accordance with an embodiment of the invention.

In the prior arts, there is only one HER and the RF coupling to the HER is optimized to balance between uniform etching at a substrate edge or deposition of polymer by-products on the beveled edge. Unlike prior art methods, a plurality of HERs may be employed with independent RF coupling to each hot edge ring to achieve both uniform etching and beveled edge cleaning of polymer by-products deposition.

Figure 4:
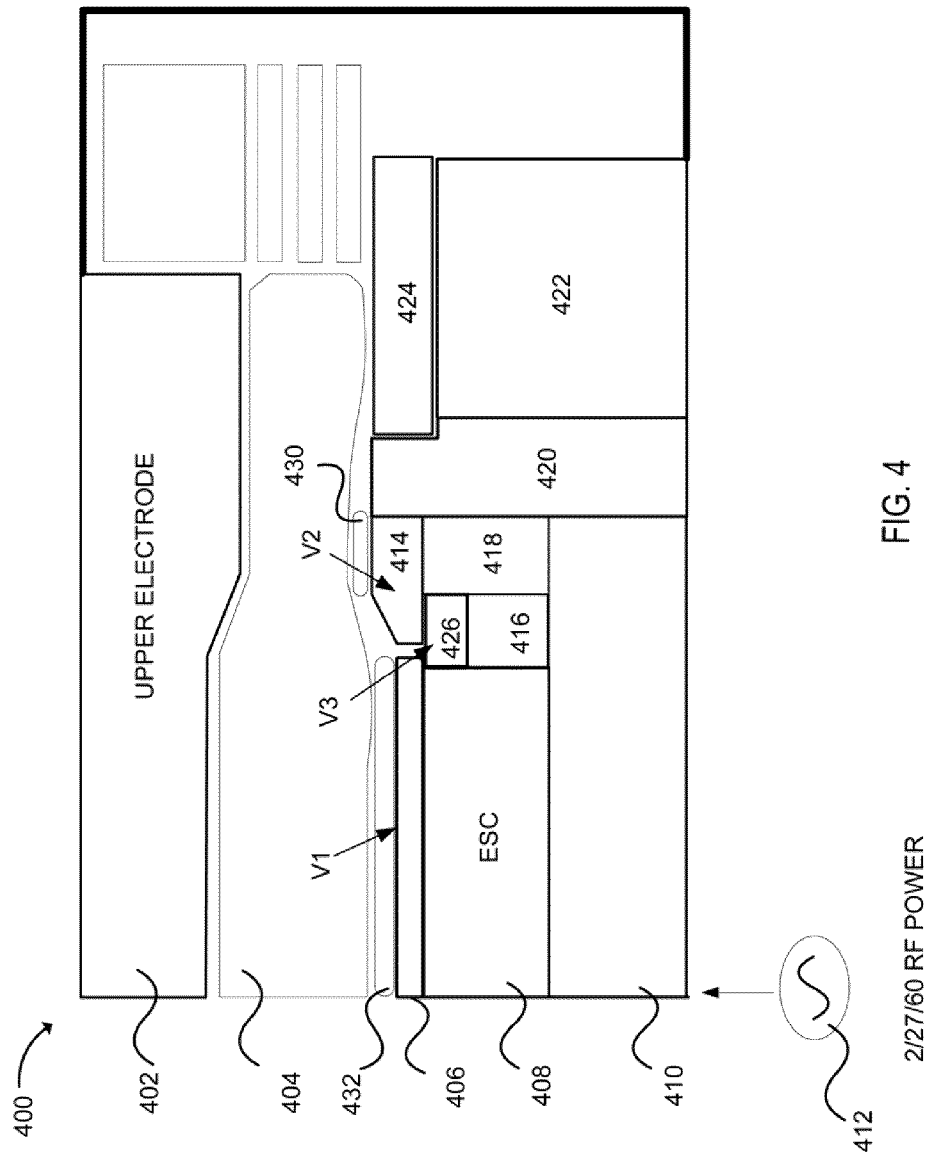
FIG. 4 shows, in accordance with an embodiment of the invention, a multi-frequency capacitively coupled plasma processing system with a plurality of hot edge rings.

In addition to the aforementioned method and arrangement as discussed in FIG. 3, other embodiments may be provided in which a plurality of HERs may be employed to provide separate RF coupling to individual HERs. FIG. 4 shows, in accordance with an embodiment of the invention, a multi-frequency capacitively coupled plasma processing system 400 with a plurality of hot edge rings. Plasma processing system 400 may be configured to include a grounded upper electrode 402, a substrate 406, an electrostatic chuck (ESC) 408, an ESC lower electrode 410, an insulator ring 420, a ground ring 422, and a quartz cover ring 424.

Consider the situation wherein, for example, substrate 406 is being processed. Plasma 404 may be struck when gas (not shown to simply the figure) interacts with RF power from an RF power generator 412. Plasma 404 may be employed to etch and/or deposit materials onto substrate 406 to create electronic devices.

As aforementioned, substrate edge effects, such as electric field, plasma temperature, and the loading effects from process chemistry, may cause the process results near the substrate edge to differ from the remaining (center) area of the substrate. For example, the equipotential lines of the plasma sheath may become disrupted, causing non-uniform ion angular distribution around the substrate edge.

In the implementation of FIG. 4, a first HER 414 is disposed above coupling ring 418 and around the edge of substrate 406. In an embodiment, first HER 414 may be made from silicon. In an embodiment, RF coupling to first HER 414 may be optimized to provide minimal potential difference (V1-V2) between substrate 406 and first HER 414 to achieve uniform etching at the edge of the substrate.

Thus, the equipotential lines of the plasma sheath above the substrate edge ring 430 with respect to the plasma sheath above the substrate 432 are optimized to keep ion bombardments to the edge of substrate 406 straight. The vertical ion bombardments at the edge of substrate 406 may ensured uniform etching with respect to the center of the substrate during plasma processing.

As shown in FIG. 4, a second HER 426 is disposed directly underneath substrate 406 and on top of an insulator ring 416. In an embodiment, second HER 426 may be made from SiN or $SiO_2$. In an embodiment, RF coupling to second HER 426 may be optimized to provide maximum potential difference (V1-V3) between substrate 406 and second HER 426 to induce arcing on beveled edge of the substrate for cleaning of polymer by-products.

As may be appreciated from the foregoing, embodiments of the invention provide methods and arrangements for independent RF coupling of each hot edge ring from a plurality of HERs being provided without employing external hardware devices. By employing independent RF couplings to a plurality of HERs, etching uniformity at substrate edge may be achieve without trading-off cleaning of polymer by-products at the beveled edge. In addition, the design of the hot edge ring arrangement is simple and inexpensive to retrofit to current plasma processing equipment While this invention has been described in terms of several preferred embodiments, there are alterations, permutations, and equivalents, which fall within the scope of this invention. Also, the title, summary, and abstract are provided herein for convenience and should not be used to construe the scope of the claims herein. It should also be noted that there are many alternative ways of implementing the methods and apparatuses of the present invention. Although various examples are provided herein, it is intended that these examples be illustrative and not limiting with respect to the invention. Further, in this application, a set of "n" items refers zero or more items in the set. It is therefore intended that the following appended claims be interpreted as including all such alterations, permutations, and equivalents as fall within the true spirit and scope of the present invention.

What is claimed is:

1. A method for processing a substrate in a plasma processing chamber, said substrate being disposed above a chuck and surrounded by a first edge ring, said first edge ring being electrically isolated from said chuck, the method comprising:
    disposing an edge of said substrate above a second edge ring;
        using a coupling ring to facilitate RF coupling from an ESC (electrostatic chuck) assembly to said first edge ring, said ESC assembly including said chuck;
    optimizing said RF coupling to minimize a potential difference between said substrate and said first edge ring;
    maximizing a potential difference between said substrate and said second edge ring to induce arcing on said edge of said substrate; and
    using said arcing to remove polymer by-products deposited on said edge of said substrate.

2. The method of claim 1 further comprising disposing said second edge ring above an insulator ring, said insulator ring surrounding said chuck.

3. The method of claim 1, wherein said coupling ring is formed of a material that includes at least one of conductive material, aluminum and graphite.

4. The method of claim 2, wherein said insulator ring is formed of a material that includes at least one of insulator material and quartz.

5. The method of claim 1, wherein said insulator ring is formed of a material that includes at least one of insulator material and quartz.

6. The method of claim 1, wherein said RF power being delivered to said chuck has a set of RF frequencies that includes at least one of 2 MHz, 27 MHz, and 60 MHz.

7. A method for processing a substrate in a plasma processing chamber, wherein said plasma processing chamber includes a plurality of hot edge rings consisting of a first edge ring and a second edge ring, said substrate being disposed above a chuck and surrounded by said first edge ring, said first edge ring being electrically isolated from said chuck, the method comprising:
    disposing an edge of said substrate above said second edge ring;
    using a coupling ring to facilitate RF coupling from an ESC (electrostatic chuck) assembly to said first edge ring, said ESC assembly including said chuck;
        optimizing said RF coupling to minimize a potential difference between said substrate and said first edge ring;
    maximizing a potential difference between said substrate and said second edge ring to induce arcing on said edge of said substrate; and
    using said arcing to remove polymer by-products deposited on said edge of said substrate.

8. The method of claim 1, wherein said first edge ring is formed of a material that includes at least one of silicon, silicon nitride and silicon dioxide.

9. The method of claim 1, wherein said second edge ring is formed of a material that includes at least one of silicon, silicon nitride and silicon dioxide.

* * * * *